(12) United States Patent
Guillot (10) Patent No.: US 10,884,028 B2
(45) Date of Patent: Jan. 5, 2021

(54) CURRENT SENSOR WITH FLUXGATE

(71) Applicant: SAFRAN ELECTRONICS & DEFENSE, Boulogne Billancourt (FR)

(72) Inventor: François Guillot, Boulogne Billancourt (FR)

(73) Assignee: SAFRAN ELECTRONICS & DEFENSE, Boulogne Billancourt (FR)

(*) Notice: Subject to any disclaimer, the term of this patent is extended or adjusted under 35 U.S.C. 154(b) by 9 days.

(21) Appl. No.: 16/470,480

(22) PCT Filed: Dec. 19, 2017

(86) PCT No.: PCT/EP2017/083671
§ 371 (c)(1),
(2) Date: Jun. 17, 2019

(87) PCT Pub. No.: WO2018/115032
PCT Pub. Date: Jun. 28, 2018

(65) Prior Publication Data
US 2019/0317135 A1 Oct. 17, 2019

(30) Foreign Application Priority Data
Dec. 19, 2016 (FR) ...................................... 16 62794

(51) Int. Cl.
*G01R 15/18* (2006.01)
*G01R 33/04* (2006.01)

(52) U.S. Cl.
CPC .......... *G01R 15/185* (2013.01); *G01R 33/04* (2013.01)

(58) Field of Classification Search
None
See application file for complete search history.

(56) References Cited

U.S. PATENT DOCUMENTS

| 3,435,337 A | 3/1969 | Inouye et al. |
| 2008/0252289 A1 | 10/2008 | Lenglet |
| 2015/0108967 A1* | 4/2015 | Barczyk ............... G01R 15/183 324/202 |

FOREIGN PATENT DOCUMENTS

| EP | 0137347 A1 | 4/1985 |
| EP | 1746430 A1 | 1/2007 |

(Continued)

*Primary Examiner* — Paresh Patel
(74) *Attorney, Agent, or Firm* — Muncy, Geissler, Olds & Lowe, P.C.

(57) ABSTRACT

A fluxgate current sensor comprising an excitation coil (13), an excitation module (20) for generating an excitation voltage (Ve), a measurement coil (14) conveying an induced measurement current (Iim), and a measurement synchronous demodulator (12) for the purpose of multiplying the induced measurement current by a demodulation signal of frequency $2f_0$ in order to obtain an image voltage that is the image of the current for measuring. The excitation voltage (Ve) is obtained from a first voltage of frequency $f_0$ and from a second voltage of frequency $3f_0$, the fluxgate current sensor further includes a servo-control coil (15) conveying an induced servo-control current, and a servo-control synchronous demodulator (30) for the purpose of multiplying the induced servo-control current by a demodulation signal of frequency $3f_0$. The servo-control synchronous demodulator is connected to the excitation module in order to servo-control the excitation voltage in such a manner as to cancel the component of frequency $3f_0$ in the induced servo-control current.

6 Claims, 6 Drawing Sheets

(56) References Cited

FOREIGN PATENT DOCUMENTS

| FR | 2942880 A1 | 9/2010 |
|----|------------|--------|
| WO | WO 91/013366 A1 | 9/1991 |
| WO | WO 2014/047644 A2 | 3/2014 |
| WO | WO 2016/016038 A1 | 2/2016 |

* cited by examiner

CURRENT SENSOR WITH FLUXGATE

BACKGROUND OF THE INVENTION

Figure 1:
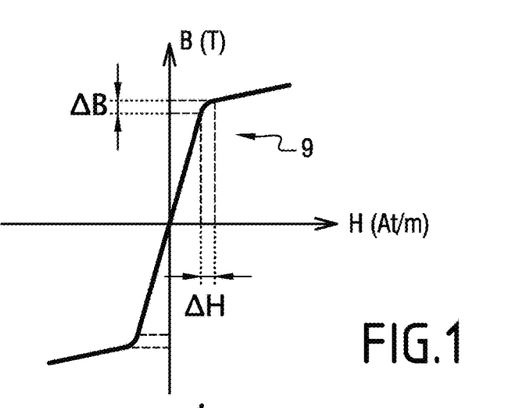
FIG. 1 shows the curve for a transfer function between a magnetic field and magnetic inductance.

A fluxgate current sensor makes use of the property of a magnetic material forming a magnetic core to become saturated as from a certain level of magnetic excitation. With reference to FIG. 1, for an increasing magnetic field H, the slope of the transfer function between the magnetic field H and the magnetic induction B decreases greatly as from a so-called "saturation value" of the magnetic core. In FIG. 1, the saturation value corresponds to the ranges ΔH and ΔB.

Figure 2:
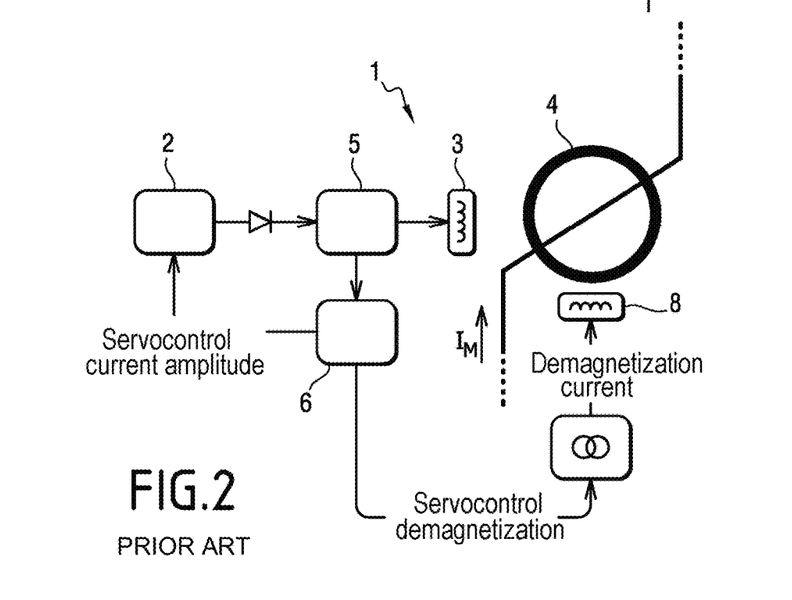
FIG. 2 shows a prior art fluxgate current sensor.
Figure 3:
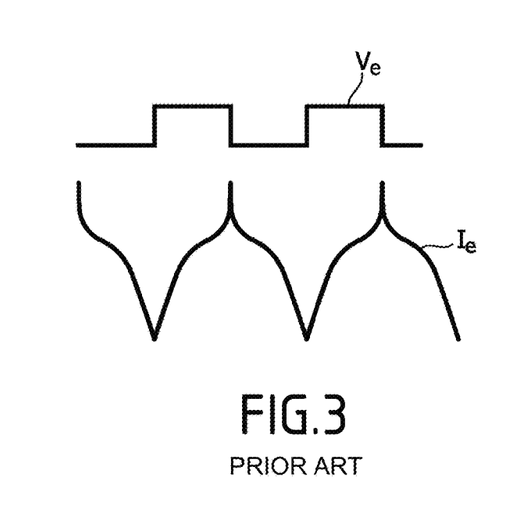
FIG. 3 shows the curve for an excitation voltage and the curve for an excitation current that excites a magnetic core of a prior art fluxgate current sensor.

With reference to FIGS. 2 and 3, in a conventional fluxgate current sensor 1 for measuring a current Im flowing in a conductor, a rectangular signal generator 2 applies a rectangular excitation voltage Ve to the terminals of an excitation coil 3 wound around the magnetic core 4. The excitation current Ie flowing in the excitation coil 3 is measured by a measurement module 5. A peak detector 6, connected to the measurement module 5 provides two pieces of information: the saturation level, and the difference between the peak currents of the excitation current Ie. The saturation level serves to servo-control the amplitude of the excitation voltage Ve. The difference between the peak currents of the excitation current Ie serves to estimate the current Im for measuring and, via a voltage-to-current converter 7, to servo-control the amplitude of a demagnetization current that flows in a demagnetization coil 8 and that serves to compensate for the magnetic flux produced in the magnetic core 4 by the current Im for measuring.

Fluxgate current sensors are preferred in certain applications. This applies in particular for measuring a current flowing in a solid state power controller (SSPC) type cut-off member for user equipment, or for measuring a current flowing in a power electronic module (PEM) type energy converter member connected to a phase of a motor.

Conventional fluxgate current sensors suffer from certain weaknesses. In particular, peak detection is relatively sensitive to external electromagnetic disturbances, which can consequently degrade the accuracy with which the current for measuring is measured. Furthermore, peak detection does not give accurate information suitable for servo-controlling on the saturation bend of the magnetic core. This is particularly problematic when the external electromagnetic disturbances are large, e.g. in the environment of a switch mode power converter. The same applies when the conventional fluxgate current sensor 1 is constrained by a difficult thermal environment causing the intrinsic characteristics of the magnetic core to drift.

Naturally, this problem of accuracy is made worse when the frequency range of the current Im for measuring increases (when the current for measuring is an alternating current), or when the operating temperature range of the fluxgate current sensor increases.

OBJECT OF THE INVENTION

An object of the invention is to improve the accuracy of a fluxgate current sensor.

SUMMARY OF THE INVENTION

In order to achieve this object, there is provided a fluxgate current sensor comprising a magnetic core that extends around a conductor conveying a current for measuring, an excitation coil, an excitation module connected to the excitation coil in order to generate an excitation voltage across the terminals of the excitation coil, a measurement coil conveying an induced measurement current, and a measurement synchronous demodulator connected to the measurement coil for the purpose of multiplying the induced measurement current by a demodulation signal of frequency $2f_0$ in order to obtain an image voltage that is the image of the current for measuring. The excitation voltage is obtained from a first voltage of frequency $f_3$ and from a second voltage of frequency $3f_0$. The fluxgate current sensor further includes a servo-control coil conveying an induced servo-control current, and a servo-control synchronous demodulator connected to the servo-control coil for the purpose of multiplying the induced servo-control current by a demodulation signal of frequency $3f_0$. The servo-control synchronous demodulator is connected to the excitation module in order to servo-control the excitation voltage in such a manner as to cancel the component of frequency $3f_0$ in the induced servo-control current.

The fluxgate current sensor of the invention enables the excitation voltage to be servo-controlled accurately in such a manner that the fluxgate current sensor operates at its optimum operating point, corresponding to the bend 9 in the transfer function shown in FIG. 1. The optimum operating point corresponding to maximum gain for the fluxgate current sensor. The fluxgate current sensor is thus less sensitive to external electromagnetic disturbances, and is thus more accurate.

The invention can be better understood in the light of the following description of a particular non-limiting embodiment of the invention.

BRIEF DESCRIPTION OF THE DRAWINGS

Reference is made to the accompanying drawings, in which.

DETAILED DESCRIPTION OF THE INVENTION

Figure 4:
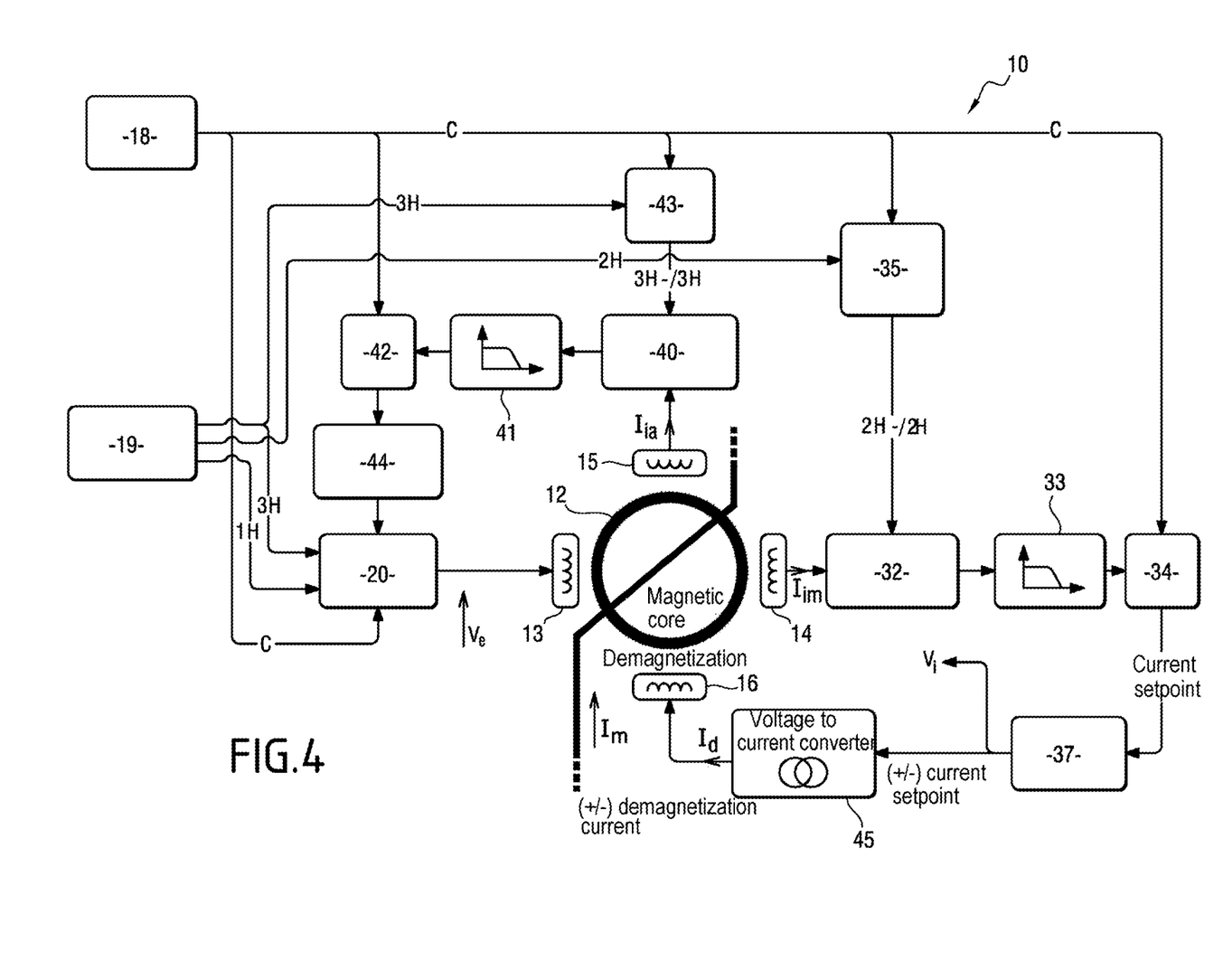
FIG. 4 shows a fluxgate current sensor of the invention.

With reference to FIG. 4, the fluxgate current sensor 10 of the invention is used in this example to measure a current Im for measuring that is flowing in a conductor 11.

The fluxgate current sensor 10 includes a transformer having a magnetic core 12 with four coils wound around the magnetic core 12. The magnetic core 12 extends around the conductor 11.

The four coils comprise an excitation coil 13, a measurement coil 14, a servo-control coil 15, and a demagnetization coil 16. The measurement coil 14 and the servo-control coil 15 are both constituted in this example by a respective pair of windings. The excitation coil 13 is used for exciting the magnetic core 12.

The fluxgate current sensor 10 also has a low frequency generator 18, a high frequency generator 19, and an excitation module 20 that is connected to the excitation coil 13.

The low frequency generator 18 transmits a signal C to two demodulators 42, 43, 34, and 35. The high frequency generator 19 transmits to the excitation module 20 a signal 1H at the frequency $f_0$ (as $\sin(\omega_0 t)$, with $\omega_0 = 2\pi f_0$) together with a signal 3H at the frequency $3f_0$ (as $\sin(3\omega_0 t)$, with $\omega_0 = 2\pi f_0$).

Figure 5:
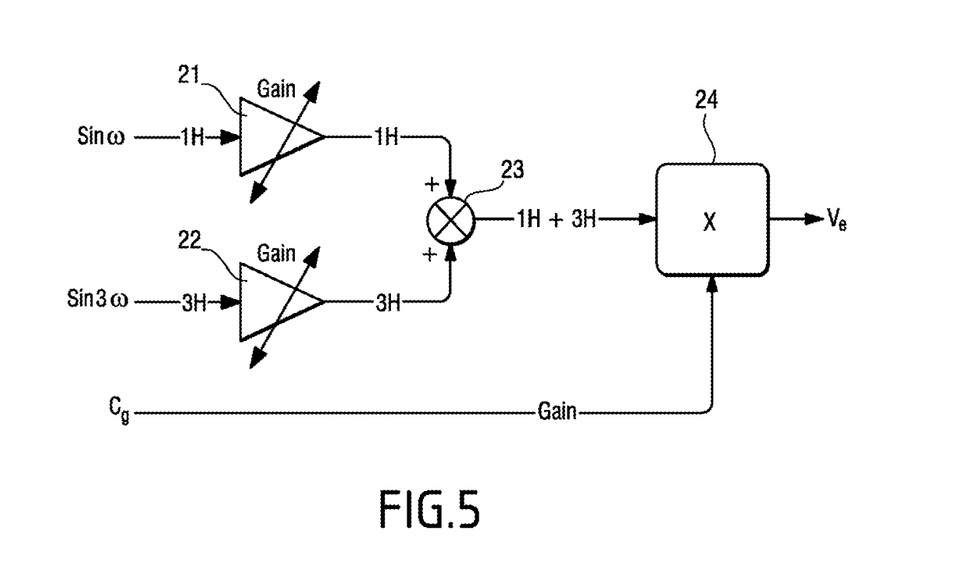
FIG. 5 shows an excitation module for the fluxgate current sensor of the invention.

With reference to FIG. 5, the excitation module 20 comprises a plurality of functional blocks, including a first amplifier block 21 of variable gain, a second amplifier block 22 of variable gain, a summing block 23, and a gain block 24.

The first amplifier block 21 receives the signal 1H at the frequency $f_0$, the second amplifier block 22 receives the signal 3H at the frequency $3f_0$, and the gain block 24 receives a gain setpoint Cg. The summing block 23 sums the outputs from the first amplifier block 21 and from the second amplifier block 22.

The excitation module 20 thus serves to generate an excitation voltage Ve from a first voltage V1 of frequency $f_0$ and from a second voltage V2 of frequency $3f_0$.

The measurement coil 14 is used for measuring the current Im. The fluxgate current sensor 10 includes a measurement synchronous demodulator 32, a first lowpass filter 33, and a first unit gain block 34 which are connected in series with the measurement coil 14. The first unit gain block 34 produces a gain that can be selected to be equal to 1 or to −1. The first unit gain block 34 receives a switching signal C from the low frequency generator 18. The measurement synchronous demodulator 32 is connected to a first selector block 35. The first selector block 35 receives a switching signal C from the low frequency generator 18 and a signal 2H of frequency $2f_0$ from the high frequency generator 19. The first selector block 35 produces a demodulation signal of frequency $2f_0$ written respectively 2H− or 2H depending on whether it is in phase with or in phase opposition with the signal 2H at the frequency $2f_0$. The demodulator signal 2H−/2H is a $\cos(2\omega_0 t)$ signal, where $\omega_0 = 2\pi f_1$. The measurement synchronous demodulator 32 multiplies, by the demodulation signal 2H−/2H, an induced measurement current Iim flowing in the measurement coil 14 and induced by the current Im for measuring. A first proportional integral corrector 37 connected to the first unit gain block 34 produces an image voltage Vi that is the image of the current Im for measuring.

Figure 6:
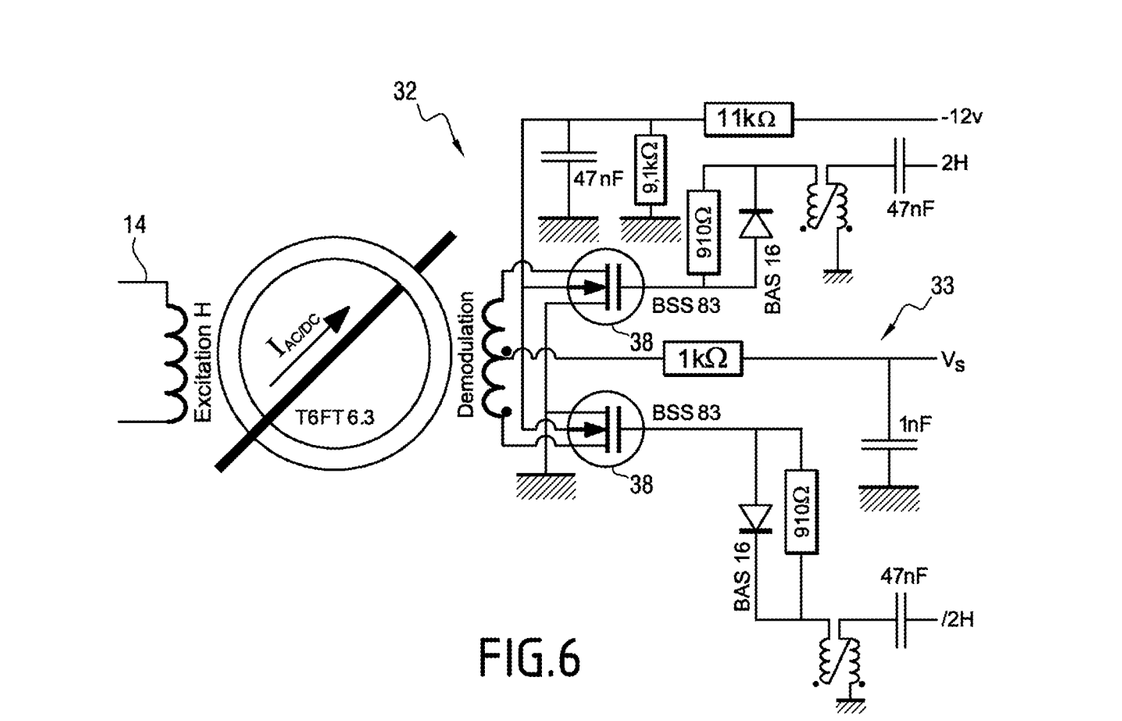
FIG. 6 shows an example of a measurement synchronous demodulator of the fluxgate current sensor of the invention.

With reference to FIG. 6, the measurement synchronous demodulator 32 has an analog switch making use of fast switches 38 of metal oxide on silicon (MOS) type. The first lowpass filter 33 is a passive filter. The analog switch is clocked by the demodulation signal 2H−/2H in phase or in phase opposition. The output voltage Vs from the first lowpass filter 33 is an image voltage that is the image of the second order harmonic component of the excitation voltage Ve.

Figure 7:
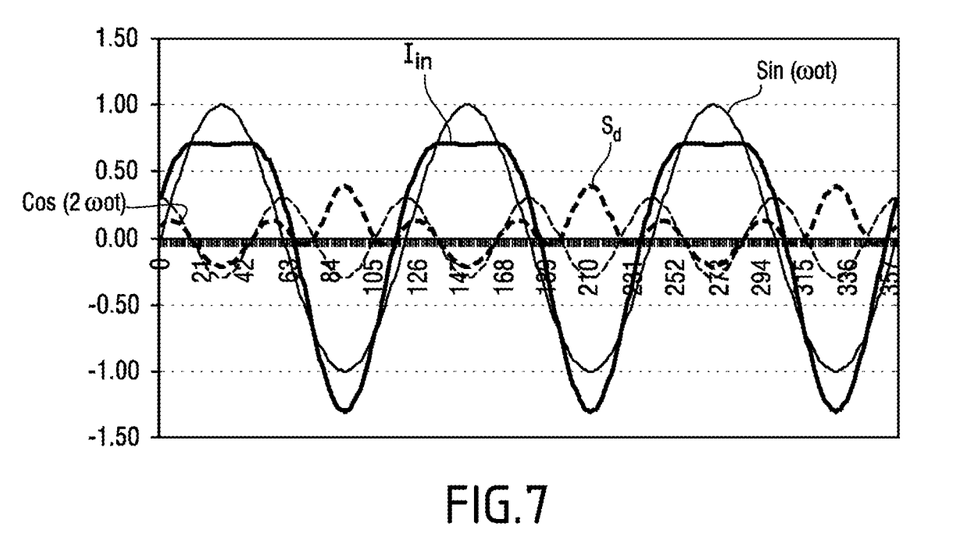
FIG. 7 shows voltage curves coming from the fluxgate current sensor of the invention when subjected to the field emitted by a conductor conveying a direct current (DC)

With reference to FIG. 7, it can be seen that saturation on the magnetic coil 12 leads to asymmetry in the induced measurement current Iim, which induced measurement current Iim is constituted by the sum of a $\sin(\omega_0 t)$ component of frequency $f_0$ corresponding to the fundamental plus a $\cos(2\omega_0 t)$ component of frequency $2f_0$ corresponding to the second order harmonic component. The mean component of the demodulated signal Sd is non-zero and positive. By taking the opposite saturation, the mean component of the demodulated signal Sd becomes negative.

The servo-control coil 15 conveying an induced servo-control current Iia is used to control the excitation voltage Ve. The fluxgate current sensor 10 has a servo-control synchronous demodulator 40, a second lowpass filter 41, and a second unit gain block 42, which are connected in series with the servo-control coil 15. The second unit gain block 42 produces gain that can be selected to be equal to 1 or to −1. The second unit gain block 42 receives a DC signal C from the low frequency generator 18. The servo-control synchronous demodulator 40 is connected to a second selector block 43. The second selector block 43 receives a switching signal C from the low frequency generator 18 and a signal 3H of frequency $3f_0$ from the high frequency generator. The second selector block 43 produces a demodulation signal 3H−/3H of frequency $3f_0$ that is in phase or in phase opposition. The demodulation signal 3H−/3H is a $\sin(3\omega_0 t)$ signal, where $\omega_0 = 2\pi f_0$. The servo-control synchronous demodulator 40 multiplies the servo-control induced current Iia by the demodulation signal 3H−/3H. A second proportional integral corrector 44 is connected between the second unit gain block 42 and the excitation module 20. The excitation voltage Ve is thus servo-controlled so as to cancel the component of frequency $3f_0$ in the induced servo-control current Iia.

The servo-control synchronous demodulator 40 is similar to the measurement synchronous demodulator 32 shown in FIG. 6, except that the analog switch is clocked by the demodulation signal 3H−/3H in phase or in phase opposition.

The demagnetization coil 16 is connected to the output of the first proportional integral corrector 37 via a voltage-to-current converter 45. A demagnetization current Id flows in the demagnetization coil 16 in order to demagnetize the magnetic core 12.

The image voltage Vi of the current Im for measuring at the output from the first proportional integral corrector 37 is applied as input to the voltage-to-current converter 45. The voltage-to-current converter 45 produces the demagnetization current Id from the image voltage Vi of the current Im for measuring. The current output by the first unit gain block 34 forms a current setpoint that is applied as input to the first proportional corrector 37. The demagnetization current Id is thus servo-controlled from the image voltage Vi of the current Im for measuring so as to compensate the magnetic flux produced by the current Im for measuring.

The characteristics of the excitation voltage Ve are described below in greater detail.

Figure 8:
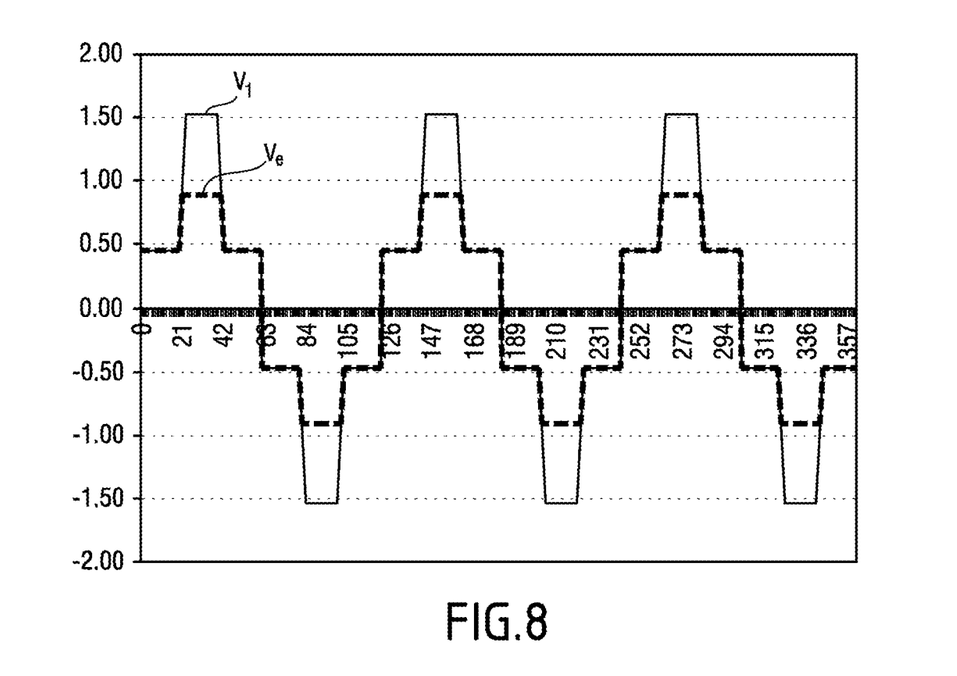
FIG. 8 shows an excitation voltage used in the fluxgate current sensor of the invention.

With reference to FIG. 8, the amplitude of the first voltage V1 and the amplitude of the second voltage V2 are regulated so as to obtain an excitation voltage Ve having its component of frequency $3f_0$ (or third order harmonic component) in phase with the component of frequency $f_0$ (or fundamental).

The third order harmonic component of the induced servo-control current Iia flowing in the servo-control coil 15, as obtained after synchronous demodulation via the servo-control synchronous demodulator 40, is positive. When the magnetic core 12 saturates, the third order harmonic component is attenuated more strongly than the fundamental, and the third order harmonic component after synchronous demodulation becomes negative since the third order harmonic goes into phase opposition with the fundamental.

Thus, when the excitation voltage Ve is such that the magnetic core 12 is approaching saturation, the ratio of the amplitude of the first order harmonic component to the amplitude of the third order harmonic component of the induced servo-control current Iia varies until the third order harmonic component is cancelled and then until the phase of the third order harmonic component is inverted. The operating point corresponding to cancellation of the third order harmonic component of the induced servo-control current Iia is thus an optimum operating point for the fluxgate current sensor 10. This optimum operating point corresponds to the bend 9 in the curve for the transfer function shown in FIG. 1.

Servo-controlling the excitation voltage Ve thus consists in controlling the excitation voltage Ve before it is applied to the terminals of the excitation coil 13 so as to cancel the third order harmonic component of the induced servo-control current Iia. The fluxgate current sensor 10 thus operates continuously on its optimum operating point. This obtains maximum gain for the asymmetries introduced by the current Im for measuring and that are detectable in the induced measurement current Iim. It should be observed that this servo-control by synchronous demodulation of the third order harmonic component is relatively insensitive to external electromagnetic disturbances, since all signals of frequency other than the frequency $3f_0$ generate intermodulation products having components that are filtered by the first lowpass filter 33 connected to the output from the measurement synchronous demodulator 32. It should also be observed that this servo-control has no need to be very fast since variations that come from external parameters (temperature, aging) are relatively slow.

As can be seen in FIG. 7, the first voltage V1 and the second voltage V2 in this example are both rectangular voltages. Rectangular voltages are simple to generate and they present odd-harmonic components that are large.

The advantage of using such an excitation voltage Ve constituted by such a first voltage V1 and such a second voltage V2 can be seen from the following.

Figure 9:
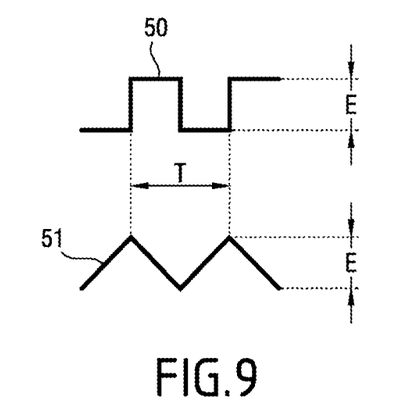
FIG. 9 shows a squarewave signal and a triangular signal.

With reference to FIG. 9, the spectral decomposition of a squarewave signal 50 of amplitude and of period T is:

$$X(t)=(4E/\pi)[\sin(\omega t)+(1/3)\sin(3\omega t)+(1/5)\sin(5\omega t)+\ldots]$$

with $\omega=2\pi/T$.

The spectral decomposition of a triangular signal 51 of amplitude E and of period T is:

$$X(t)=(8E/\pi^2)[\sin(\omega t)-(1/3^2)\sin(3\omega t)+(1/5^2)\sin(5\omega t)-\ldots]$$

with $\omega=2\pi/T$.

The triangular signal 51 thus has a negative third order harmonic component.

Figure 10:
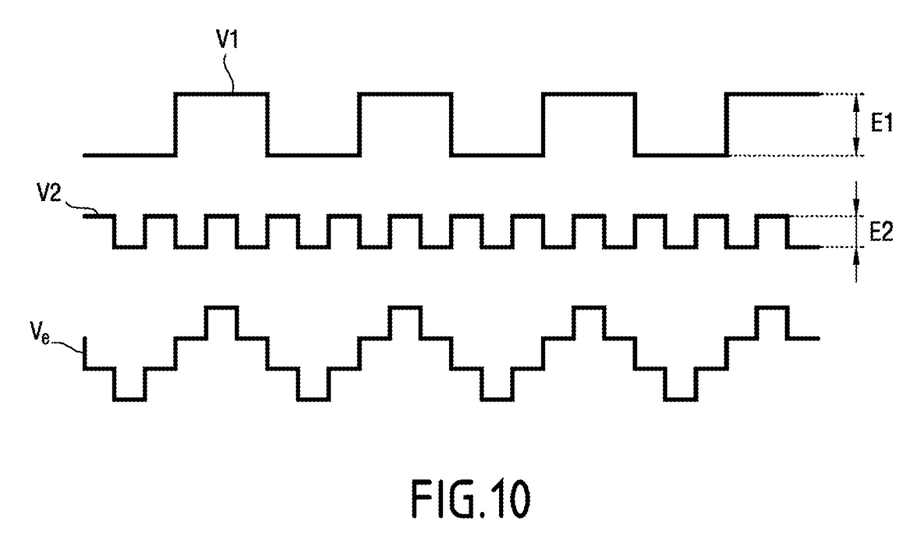
FIG. 10 shows a squarewave signal, a squarewave signal at three times the frequency, together with the sum of these two signals.

With reference to FIG. 10, adding a first voltage V1 of rectangular waveform with a second voltage V2 of rectangular waveform makes it possible, when the amplitudes of the first and second voltages V1 and V2 are correctly adjusted, to obtain an excitation voltage Ve that is generally of triangular waveform and in which the third order harmonic component is negative.

The phenomenon of the magnetic core 12 saturating causes the waveform of the induced servo-control current Iia to approximate to the waveform of a squarewave signal. On approaching saturation, the amplitude of the third order harmonic component of the induced servo-control current Iia thus tends towards zero, and then becomes negative, to match the decomposition of a squarewave signal. Control of the excitation voltage Ve is thus defined by servo-control on the point where the third order harmonic component of the induced servo-control current Iia cancels.

This particular regulation point can be found by calculation.

The first voltage V1 presents the following spectral decomposition, in sine functions:

$$X1(t)=(4E_1/\pi)[\sin(\omega_0 t)+(1/3)\sin(3\omega_0 t)+(1/5)\sin(5\omega_0 t)+\ldots]$$

The second voltage V2 presents the following spectral decomposition in sine functions:

$$X2(t)=(4E_2/\pi)[\sin(\omega_0 t)+(1/3)\sin(9\omega_0 t)+(1/5)\sin(15\omega_0 t)+\ldots]$$

The third order harmonic component of the sum of the spectral decomposition of the first voltage V1 plus the second spectral decomposition of the second voltage V2 is equal to:

$$(4/\pi)[(E_1/3)\sin(3\omega_0 t)+E_2\sin(3\omega_0 t)]$$

The third order harmonic component is thus zero when $E_1=-3E_2$.

The servo-control of the excitation voltage Ve consists in controlling the amplitude of the second voltage V2. Action is thus taken on the amplitude of the second voltage V2 in order to control the excitation voltage Ve so that the component of frequency $3f_0$ of the induced servo-control current Iia cancels.

Prior to the magnetic core 12 saturating, the looked-for control of the excitation voltage Ve thus needs to include a relative level of excitation by the third order harmonic component that gives a result that is slightly negative after demodulation by the servo-control synchronous demodulator 40 so as to make it possible, on saturation, to cross through zero and then become negative. Adjustment should be made on this particular point in order to find the best gain compromise for the transfer function that corresponds to the optimum operating point and to the bend 9 in the transfer function shown in FIG. 1.

It should be observed that the signal 2H of frequency $2f_0$ and the signal 3H of frequency $3f_0$ are periodically phase inverted, specifically at a frequency of 10 kilohertz (kHz). The shifts in phase opposition are averaged by the first proportional integral corrector 37 and by the second proportional integral corrector 44, and they are thus cancelled. This function of phase inversion at 10 kHz serves to compensate for unbalances between the measurement and servo-control channels, as results from imperfections in the analog components used. This serves to improve the accuracy with which the fluxgate current sensor 10 is set on the optimum operating point, and thus the overall accuracy of the fluxgate current sensor 10 itself.

Figure 11:
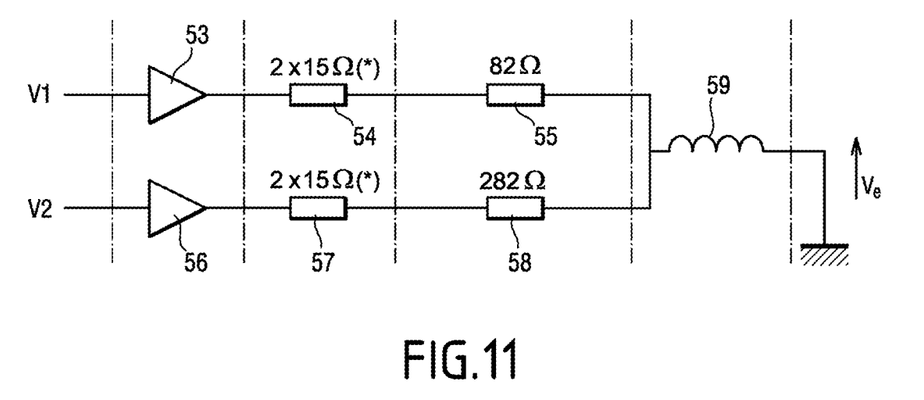
FIG. 11 shows an example of a particular circuit for determining the magnitude of the excitation signal.

With reference to FIG. 11, in order to adjust the excitation voltage Ve, use is made of a first amplifier 53 connected as a buffer, two first output resistors 54 each having a resistance of 15 Ohms ($\Omega$), a first adjustment resistor 55, a second amplifier 56 connected as a buffer, two second output resistors 57 each of 15$\Omega$, and a second adjustment resistor 58. A load 59 thus has an excitation voltage applied thereto such that $E_1=2.78E_2$. The value 2.78 is less than 3, and thus the level of the third order harmonic component in the excitation voltage Ve is greater than that of a squarewave signal, which corresponds to a demodulated signal that is negative.

Figure 12:
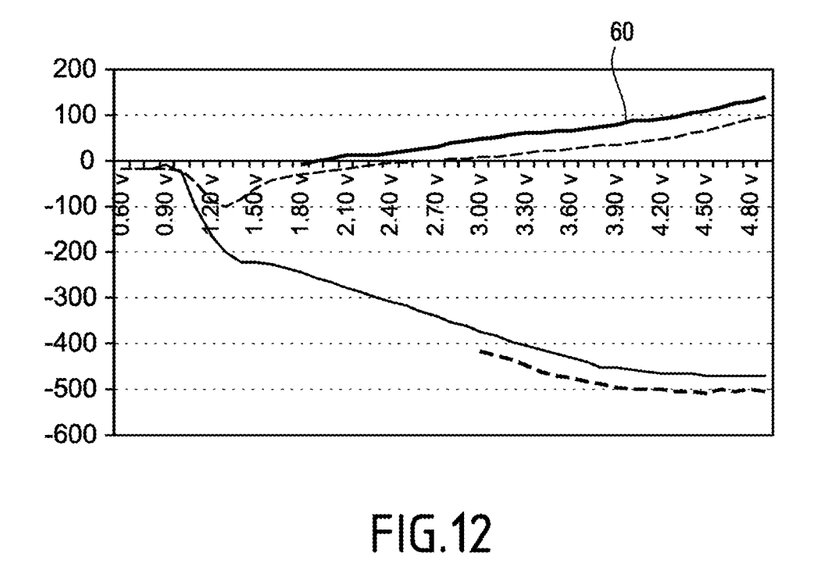
FIG. 12 shows a curve for an output voltage from a synchronous demodulator for servo-controlling the fluxgate current sensor of the invention, plotted as a function of an excitation voltage.

With reference to FIG. 12, the harmonic component of the voltage 60 at the output from the servo-control synchronous demodulator 40 cancels for an excitation voltage close to 3V and above that it becomes positive. The zero crossing thus corresponds to the optimum operating point for the fluxgate current sensor 10. By servo-controlling the induced servo-control current Iia on this zero crossing point, the transfer function of the fluxgate current sensor 10 of the invention remains in the bend 9 of FIG. 1.

The fluxgate current sensor 10 presents certain advantages over existing fluxgate current sensors.

The improvement in the regulation of the operating point by means of the demodulation by the servo-control synchronous demodulator 40 serves to obtain better noise immunity.

Furthermore, the use of synchronous demodulators makes it possible to operate at high frequency, thereby enabling the current Im for measuring to have a large bandwidth, while conserving very good immunity to external electromagnetic disturbances.

Since measurement is always performed in the optimum operating point corresponding to the saturation bend 9, the sensitivity of the fluxgate current sensor 10 is constant over the temperature range. The accuracy of the fluxgate current sensor 10 is thus good over a large temperature range.

The fluxgate current sensor 10 is insensitive to manufacturing drifts in certain characteristics of the magnetic core 12. In particular, the magnetic permeability characteristics of conventional magnetic cores, which are not intended for use in their saturation zone, can be very dissimilar. Having accurate servo-control on the operating point serves to correct for such dispersion. It is thus possible to use standard magnetic cores, thereby reducing industrial constraints on manufacturing the magnetic core, and thus on the cost of the fluxgate current sensor 10. By way of example, it is thus possible to use a ferrite magnetic core of the kind conventionally used in power supply converters and in certain radio functions.

It should also be observed that the fluxgate current sensor 10 is of an architecture that can be transposed to digital solutions in order to improve the reproducibility and thus the manufacture of the fluxgate current sensor 10. Thus, the excitation voltage Ve may be produced by a fast analog-to-digital converter. Similarly, the measurement and servo-control synchronous demodulators 32 and 40 may be implemented by means of a digital computer (e.g. a field programmable gate array (FPGA). Demagnetization may also be done via a digital-to-analog converter.

It should be observed that it would be possible to use not one but rather two magnetic cores. The second magnetic core would receive the same excitation as the measurement circuit, but in phase opposition, in order to cancel the flux directly in the conductor conveying the current for measuring.

Naturally, the invention is not limited to the embodiment described but covers any variant coming within the ambit of the invention as defined by the claims.

The invention claimed is:

1. A fluxgate current sensor comprising a magnetic core that extends around a conductor conveying a current for measuring, an excitation coil, an excitation module connected to the excitation coil in order to generate an excitation voltage across the terminals of the excitation coil, a measurement coil conveying an induced measurement current, and a measurement synchronous demodulator connected to the measurement coil for the purpose of multiplying the induced measurement current by a demodulation signal of frequency $2f_0$ in order to obtain an image voltage that is the image of the current for measuring, the sensor being characterized in that the excitation voltage is obtained from a first voltage of frequency $f_0$ and from a second voltage of frequency $3f_0$, in that the fluxgate current sensor further includes a servo-control coil conveying an induced servo-control current, and a servo-control synchronous demodulator connected to the servo-control coil for the purpose of multiplying the induced servo-control current by a demodulation signal of frequency $3f_0$, and in that the servo-control synchronous demodulator is connected to the excitation module in order to servo-control the excitation voltage in such a manner as to cancel the component of frequency $3f_0$ in the induced servo-control current.

2. The fluxgate current sensor according to claim 1, wherein the first voltage and the second voltage are rectangular voltages.

3. The fluxgate current sensor according to claim 1, wherein the excitation voltage represents a generally triangular waveform.

4. The fluxgate current sensor according to claim 1, wherein the excitation voltage is servo-controlled by servo-controlling the amplitude of the second voltage.

5. The fluxgate current sensor according to claim 1, wherein the demodulation signal of frequency $2f_0$ is a cos $2\omega_0 t$ signal, where $\omega_0 = 2\pi f_0$.

6. The fluxgate current sensor according to claim 1, further including a demagnetization coil conveying a demagnetization current that is servo-controlled from the voltage that is the image of the current for measuring in order to compensate for magnetic flux produced by the current for measuring.

* * * * *